United States Patent
Goshi et al.

(10) Patent No.: US 10,619,922 B2
(45) Date of Patent: Apr. 14, 2020

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Gentaro Goshi, Kumamoto (JP); Hiromi Kiyose, Kumamoto (JP); Satoshi Biwa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 357 days.

(21) Appl. No.: 15/441,864

(22) Filed: Feb. 24, 2017

(65) Prior Publication Data

US 2017/0254589 A1    Sep. 7, 2017

(30) Foreign Application Priority Data

Mar. 3, 2016 (JP) .................... 2016-041319

(51) Int. Cl.

| | |
|---|---|
| *F26B 21/14* | (2006.01) |
| *F26B 5/00* | (2006.01) |
| *F26B 9/06* | (2006.01) |
| *H01L 21/02* | (2006.01) |
| *H01L 21/67* | (2006.01) |

(52) U.S. Cl.
CPC .............. *F26B 21/14* (2013.01); *F26B 5/00* (2013.01); *F26B 9/06* (2013.01); *H01L 21/02101* (2013.01); *H01L 21/67034* (2013.01)

(58) Field of Classification Search
None
See application file for complete search history.

(56) References Cited

U.S. PATENT DOCUMENTS

| | | | | |
|---|---|---|---|---|
| 5,306,350 A | * | 4/1994 | Hoy | ........................ B05B 7/32 |
| | | | | 134/11 |
| 8,410,393 B2 | * | 4/2013 | Ricci | ................ H01J 37/32715 |
| | | | | 118/715 |
| 2008/0264443 A1 | | 10/2008 | Shrinivasan et al. | |
| 2012/0048304 A1 | * | 3/2012 | Kitajima | ........... H01L 21/02101 |
| | | | | 134/30 |

FOREIGN PATENT DOCUMENTS

| | | |
|---|---|---|
| JP | 08-206485 A | 8/1996 |
| JP | 2008-034593 A | 2/2008 |
| JP | 2012-049446 A | 3/2012 |
| JP | 2012-243776 A | 12/2012 |
| JP | 2013-012538 A | 1/2013 |

* cited by examiner

*Primary Examiner* — Eric W Golightly
(74) *Attorney, Agent, or Firm* — Abelman, Frayne & Schwab (57) ABSTRACT

Provided is a substrate processing apparatus including a processing container configured to receive a substrate on which a dry preventing liquid is filled and perform a supercritical processing on the substrate; a fluid supply line connected to the processing container and configured to supply a processing fluid to the processing container; a fluid discharge line connected to the processing container and configured to discharge the processing fluid in the processing container; and a first circulation line connected to an upstream side and a downstream side of the processing container, and provided independently from the fluid supply line and the fluid discharge line to circulate the processing fluid in the processing container. The first circulation line is provided with a first reservoir tank that receives the processing fluid from the processing container and has a capacity larger than that of the processing container.

13 Claims, 4 Drawing Sheets

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2016-041319 filed on Mar. 3, 2016 with the Japan Patent Office, the disclosure of which is incorporated herein in its entirety by reference.

TECHNICAL FIELD

The present disclosure relates to a technique of removing a liquid attached on a surface of a substrate using a processing fluid in a supercritical state or a subcritical state.

BACKGROUND

In a manufacturing process of a semiconductor device in which a laminated structure of an integrated circuit is formed on a surface of, for example, a semiconductor wafer (hereinafter, referred to as a "wafer") as a substrate, a liquid processing step is performed to process the surface of the wafer using a liquid, for example, to remove fine dust or a natural oxide film on the surface of the wafer using a cleaning liquid such as, for example, chemical liquid.

There has been known a method using a processing fluid in a supercritical state or a subcritical state (hereinafter, collectively referred to as a "high pressure state") when removing a liquid attached to the surface of the wafer in such a liquid processing step.

Japanese Patent Laid-Open Publication No. 2013-012538 discloses a method of drying a substrate, including bringing a liquid attached on a pattern formed on a substrate in a processing container into contact with carbon dioxide (processing fluid) in a supercritical state or a subcritical state to discharge a part of the carbon dioxide in the supercritical state from which the liquid is extracted in the processing container from a discharge line, and removing the liquid while continuing to supplying new carbon dioxide in a supercritical state from a fluid supply line without significantly lowering a liquid extracting ability by carbon dioxide in a supercritical state in the processing container.

In this case, if carbon dioxide is used as a processing fluid for a long period of time while suppressing a discharge amount of the carbon dioxide, consumption of the processing fluid may be lowered.

SUMMARY

According to an aspect, the present disclosure provides a substrate processing apparatus including: a processing container configured to receive a substrate on which a dry preventing liquid is filled and perform a supercritical processing on the substrate; a fluid supply line connected to the processing container and configured to supply a processing fluid to the processing container; a fluid discharge line connected to the processing container and configured to discharge the processing fluid in the processing container; and a first circulation line connected to an upstream side and a downstream side of the processing container, and provided independently from the fluid supply line and the fluid discharge line to circulate the processing fluid in the processing container. The first circulation line is provided with a first reservoir tank that receives the processing fluid from the processing container and has a capacity larger than that of the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made in consideration of the problems, and an object of the present disclosure is to provide a substrate processing apparatus and a substrate processing method capable of removing a liquid attached on a surface of a substrate using a processing fluid in a relatively short time and using the processing fluid for a long time so as to reduce consumption of the processing fluid, and a storage medium in which the method is stored.

According to an aspect, the present disclosure provides a substrate processing apparatus, including: a processing container configured to receive a substrate on which a dry preventing liquid is filled and perform a supercritical processing on the substrate; a fluid supply line connected to the processing container and configured to supply a processing fluid to the processing container; a fluid discharge line connected to the processing container and configured to discharge the processing fluid in the processing container; and a first circulation line connected to an upstream side and a downstream side of the processing container, and provided independently from the fluid supply line and the fluid discharge line to circulate the processing fluid in the processing container. The first circulation line is provided with a first reservoir tank that receives the processing fluid from the processing container and has a capacity larger than that of the processing container.

In the above-described substrate processing apparatus, the first reservoir tank has a capacity such that the dry preventing liquid filled on a plurality of substrates is not saturated even when the dry preventing liquid is dissolved in the processing fluid of a supercritical state or a subcritical state in the first reservoir tank.

In the above-described substrate processing apparatus, the fluid supply line is provided with a booster pump to supply the processing fluid to the processing container, the first circulation line is provided with a first circulation pump having an ejection flow rate higher than that of the booster pump to circulate the processing fluid in the processing container, and the first reservoir tank is provided at an upstream side of the first circulation pump.

In the above-described substrate processing apparatus, the first reservoir tank is provided with a fluid discharge device to discharge the processing fluid.

The above-described substrate processing apparatus further includes a second circulation line connected at an upstream side and a downstream side of the processing container, and provided independently from the first circulation line to circulate the fluid in the processing container. The second circulation line is provided with a second reservoir tank that receives the processing fluid from the processing container and has a capacity larger than that of the processing container.

In the above-described substrate processing apparatus, a downstream-side switch valve is provided at a downstream side of the processing container to switch the first circulation line and the second circulation line.

In the above-described substrate processing apparatus, the processing container is provided with a fluid supply header connected to the fluid supply line and a fluid discharge header connected to the fluid discharge so as to form a laminar flow of the processing fluid in the processing container.

According to another aspect, the present disclosure provides a substrate processing method including: carrying a substrate on which a dry preventing liquid is filled into a processing container; supplying a processing fluid to the processing container through a fluid supply line; performing a supercritical processing on the substrate in the processing container using the processing fluid; discharging the processing fluid in the processing container through a fluid discharge line; and circulating the processing fluid in the processing container by a first circulation line which is provided independently from the fluid supply line and the fluid discharge line. The processing fluid from the processing container is received by a first reservoir tank that is provided in the first circulation line and has a capacity larger than that of the processing container.

According to still another aspect, the present disclosure provides a non-transitory computer-readable storage medium that stores a program which, when executed, causes a computer to execute a substrate processing method including: carrying a substrate on which a dry preventing liquid is filled into a processing container; supplying a processing fluid to the processing container through a fluid supply line; performing a supercritical processing on the substrate in the processing container using the processing fluid; discharging the processing fluid in the processing container through a fluid discharge line; and circulating the processing fluid in the processing container by a first circulation line that is provided independently from the fluid supply line and the fluid discharge line. The processing fluid from the processing container is received by a first reservoir tank that has a capacity larger than that of the processing container.

According to the present disclosure, since the first circulation line is provided in the processing container and the reservoir tank is provided in the first circulation line to receive the processing fluid, a capacity of the processing fluid in the first circulation line may be increased by the reservoir tank. Therefore, even though the dry preventing liquid is dissolved in the processing fluid, it is possible to suppress increase in the dissolved concentration of the dry preventing liquid. Therefore, it is not necessary to frequently discharge the processing fluid while processing the substrate or supplement a new processing fluid every time, but the processing fluid in the first circulation line may be used for a long time, thereby reducing the consumption of the processing fluid.

Hereinafter, an exemplary embodiment of the present disclosure will be described with reference to the drawings.

FIGS. 1 to 5 are views illustrating an exemplary embodiment of the present disclosure.

Figure 1:
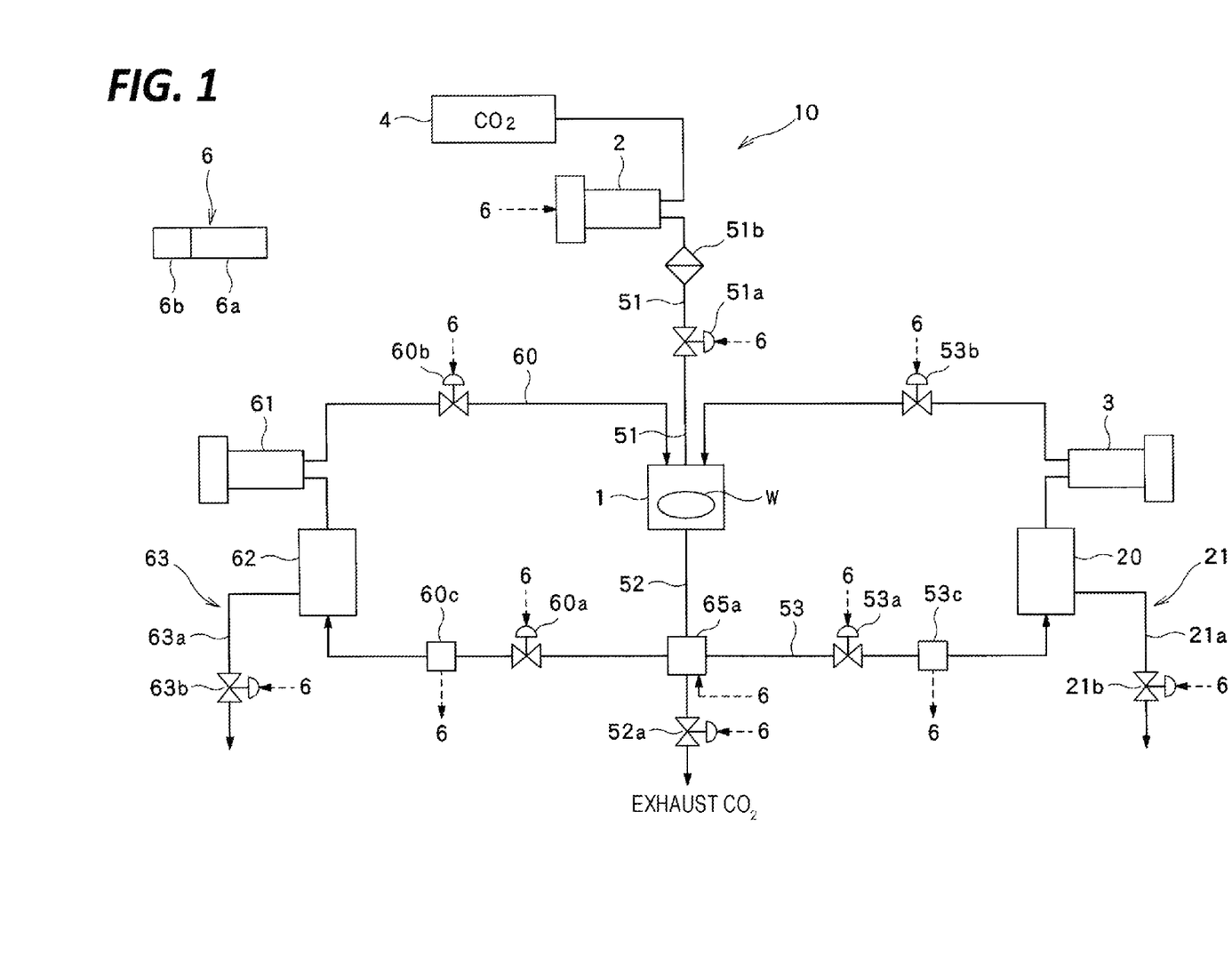
FIG. 1 is an explanatory view illustrating a configuration of a substrate processing apparatus according to an exemplary embodiment.

As illustrated in FIG. 1, a substrate processing apparatus 10 includes a processing container 1 that accommodates a wafer W on which a dry preventing liquid, for example, isopropyl alcohol (IPA) is filled and performs a supercritical processing on the wafer W, a fluid supply line 51 which is connected to the processing container 1 to supply a processing fluid such as $CO_2$ to the processing container 1, a fluid discharge line 52 that is connected to the processing container 1 to discharge fluid in the processing container 1, and a first circulation line 53 that is connected to the processing container 1 and provided independently from the fluid supply line 51 and the fluid discharge line 52 to circulate the fluid in the processing container 1.

Among these, the processing container 1 performs a supercritical processing on the wafer W using a high pressure processing fluid and removes a dry preventing liquid attached on a surface of the wafer W. Further, the fluid supply line 51 has a booster pump 2 which supplies the processing fluid. Furthermore, the fluid discharge line 52 discharges the fluid in the processing container 1 and has a decompression valve 52a which reduces a pressure in the processing container 1.

Figure 2:
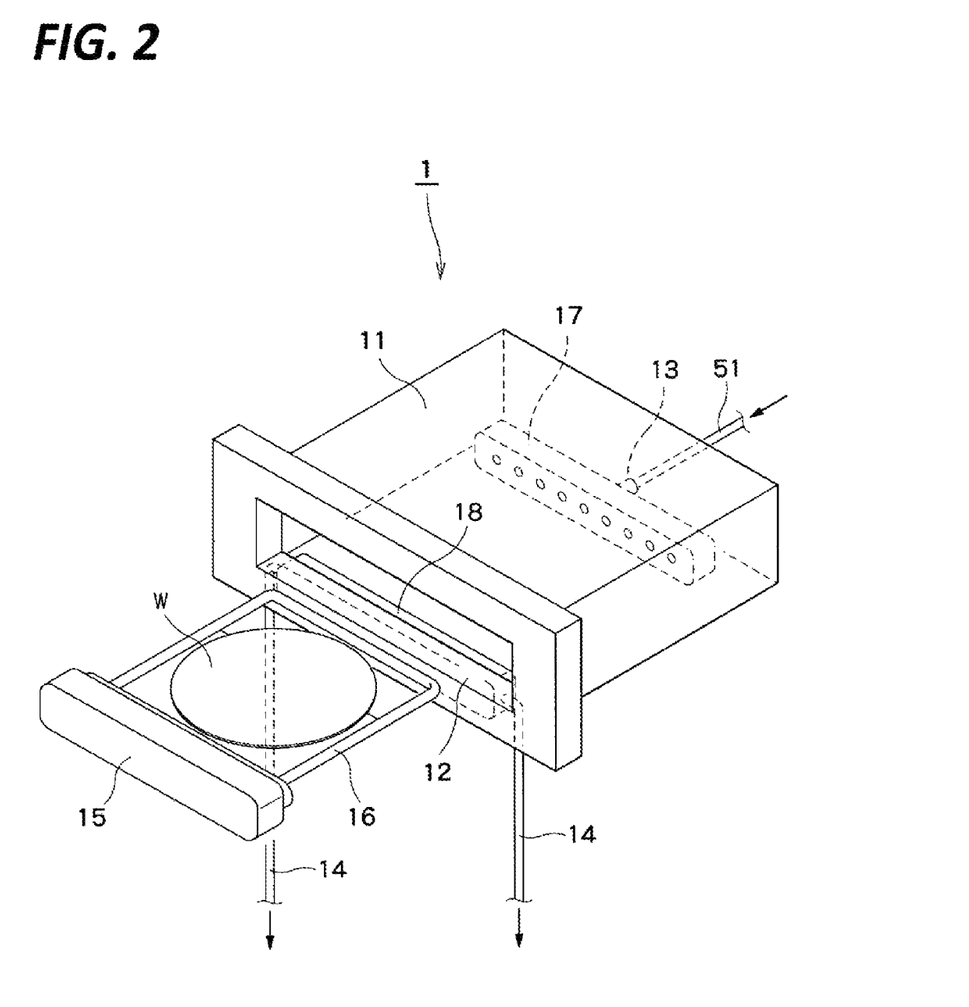
FIG. 2 is an external perspective view illustrating a processing container provided in a substrate processing apparatus.

Next, the processing container 1 will be described. As illustrated in FIG. 2, the processing container 1 includes a case type container body 11 having an opening 12 for carrying in/out the wafer W, a holding plate 16 that holds the wafer W to be processed in a horizontal direction, and a cover member 15 which supports the holding plate 16 and airtightly closes the opening 12 when the wafer W is carried in the container body 11.

The container body 11 is a container in which a processing space is formed so as to accommodate a wafer W having a diameter of 300 mm. The container body 11 includes a supply port 13 that is connected to a resupply side (an ejection side of the first circulation pump 3) of the fluid supply line 51 and the first circulation line 53 and a discharge port 14 that is connected to a discharge side (a suction side of the circulation pump 3) of the fluid discharge line 52 and the first circulation line 53, on the wall thereof. Further, the processing container 1 include a pressing device (not illustrated) that presses the cover member 15 toward the container body 11 against an internal pressure, which is applied from a high pressure processing fluid supplied in the processing space, so as to airtightly close the processing space. Further, a heat insulating material or a tape heater may be provided on a surface of the container body 11 so as to maintain a temperature of the supercritical state or subcritical state of the processing fluid supplied into the processing space. Meanwhile, a fluid supply header 17 communicating with the supply port 13 is provided on one wall of the container body 11, and a fluid discharge header 18 communicating with the discharge port 14 is provided on the other side of the container body 11 (see FIGS. 2 and 4). Further, a plurality of holes is formed in the fluid supply header 17 and a plurality of holes is also formed in the fluid discharge header 18. Therefore, a laminar flow of the processing fluid may be formed in the container body 11 by the fluid supply header 17 and the fluid discharge header 18.

The fluid supply line 51 connected to the supply port 13 of the processing container 1 (the container body 11), as illustrated in FIG. 1, is connected to a processing fluid supply unit 4 via an opening/closing valve 51a, a filter 51b, and the booster pump 2. The opening/closing valve 51a is opened or closed according to the supply of the processing fluid to the processing container 1 or stop of the supply. The filter 51b removes particles included in the processing fluid which is supplied to the processing container 1.

When the processing fluid supplied from the processing fluid supply unit 4 is gas, the booster pump 2 boosts the processing fluid to a pressure at which the processing fluid becomes a high pressure state (a supercritical state or a subcritical state). Further, when the processing fluid in a high pressure state is supplied from the processing fluid supply unit 4, the processing fluid may be sent to maintain the high pressure state in the processing container 1. As the booster pump 2 having the above-described ability, a syringe pump or a diaphragm pump having a high ejecting pressure may be generally adopted, but a discharge flow rate is lower than that of the circulation pump 3 which will be described below.

A processing fluid is supplied from the processing fluid supply unit 4 and brought into contact with a liquid on the surface of the wafer W to remove the liquid. According to the exemplary embodiment, the processing fluid supply unit 4 is configured as a bomb or a tank that reserves carbon dioxide ($CO_2$: a critical temperature of 31° C. and a critical pressure of 7.4 MPa (an absolute pressure)) in a high pressure gas state or a high pressure state (a supercritical state or a subcritical state). When $CO_2$ supplied from the processing fluid supply unit 4 is a high pressure gas, $CO_2$ is adiabatically compressed by the booster pump 2 so that the pressure and the temperature thereof rise. Thus, $CO_2$ comes into a high pressure state and is supplied to the processing container 1. Further, when $CO_2$ is in the high pressure state, the processing fluid is supplied to the processing container 1 such that the pressure is maintained in the processing container 1.

In the meantime, the discharge line 52 which is connected to the discharge port 14 of the processing container 1 (the container body 11) is connected to a processing fluid discharge unit (not illustrated) and a fluid (the processing fluid or a liquid removed from the surface of the wafer W) in the processing container 1 is discharged. The decompression valve 52a is provided in the discharge line 52. The decompression valve 52a reduces the pressure of the processing container 1 and adjusts an opening degree based on a detected value of a pressure gauge (not illustrated) which is provided in the processing container 1 and maintains the pressure in the processing container 1 to be a pressure in a high pressure state (a critical pressure of the processing fluid or a pressure in a subcritical state).

As illustrated in FIG. 1, in order to accelerate mixing of the fluid in the processing container 1, the first circulation line 53 which discharges the fluid in the processing container 1 and then returns the fluid to the processing container 1 is provided. Further, the circulation pump 3 which has a larger ejection flow rate than that of the booster pump 2 described above is provided in the first circulation line 53. As illustrated in FIG. 1, the first circulation line 53 is diverged from the discharge line 52 at a discharge side. Further, in the first circulation line 53, an opening/closing valve 53a, a flow meter 53C, a first reservoir tank 20, a first circulation pump 3, and an opening/closing valve 53b are sequentially provided from the discharge side.

The opening/closing valves 53a and 53b perform a function of disconnecting or connecting the first circulation line 53 from or to the processing container 1. When the first circulation line 53 is connected to the processing container 1, the fluid in the processing container 1 is circulated. Meanwhile, when the first circulation line 53 is disconnected from the processing container 1, the circulation stops.

As illustrated in FIG. 1, the first circulation line 53 is connected to the discharge line 52 through a downstream-side switch valve 65a. The downstream-side switch valve 65a switches the first circulation line 53 and the second circulation line 60 which will be described below.

That is, the second circulation line 60 is provided in the discharge line 52 through the downstream-side switch valve 65a. In the second circulation line 60, an opening/closing valve 60a, a flow meter 60c, a second reservoir tank 62, a second circulation pump 61, and an opening/closing valve 60b are sequentially provided in the second circulation line 60 from the discharge side.

Among these, the opening/closing valve 60a, the flow meter 60c, the second reservoir tank 62, the second circulation pump 61, and the opening/closing valve 60c of the second circulation line 60 have the same configurations and the same abilities as the opening/closing valve 53a, the flow meter 53c, the first reservoir tank 20, the first circulation pump 3, and the opening/closing valve 53b of the first circulation line 53, respectively.

In the first reservoir tank 20 of the first circulation line 53, a fluid discharge device 21 having a discharge pipe 21a connected to the first reservoir tank 20 and an opening/closing valve 21b attached to the discharge pipe 21a is provided.

Further, in the second reservoir tank 62 of the second circulation line 60, a fluid discharge device 63 having a discharge pipe 63a connected to the second reservoir tank 62 and an opening/closing valve 63b attached to the discharge pipe 63a is provided.

The opening/closing valves 60a and 60b of the second circulation line 60 perform a function of disconnecting or connecting the second circulation line 60 from or to the processing container 1. When the second circulation line 60 is connected to the processing container 1, the fluid in the processing container 1 is circulated. Meanwhile, when the second circulation line 60 is disconnected from the processing container 1, the circulation stops.

Next, configurations and functions of the first reservoir tank 20 of the first circulation line 53 and the second reservoir tank 62 of the second circulation line 60 will be described. Here, the first reservoir tank 20 and the second reservoir tank 62 have the same configuration and the same function. That is, the first reservoir tank 20 and the second reservoir tank 62 receive the processing fluid so that a capacity of the processing fluid in the first circulation line 53 and the second circulation line 60 may be increased by the first reservoir tank 20 and the second reservoir tank 62.

As illustrated in FIG. 1, the downstream-side switch valve 65a is switched to induce the processing fluid in the processing container 1, for example, to the first circulation line 53.

The processing fluid entering the first circulation line 53 is a fluid provided to perform a supercritical processing on the wafer W in the processing container 1 and dissolves the dry preventing liquid (e.g., IPA) attached on the surface of the wafer W. The processing fluid introduced into the first circulation line 53 enters the first reservoir tank 20. During this process, since the dry preventing liquid is dissolved into the processing fluid, the solubility of the dry preventing liquid is increased in the processing fluid. However, since the capacity of the processing fluid in the first circulation line 53 is increased by the first reservoir tank 20, increase in dissolved concentration of the dry preventing liquid in the processing fluid may be suppressed. Thereafter, the processing fluid in the first reservoir tank 20 is sent to the processing container 1 by the first circulation pump 3 and the dry preventing liquid on the wafer W may be removed using a processing fluid having a low solubility of the dry preventing liquid. In contrast, when the first reservoir tank 20 is not provided in the first circulation line 53, the solubility of the dry preventing liquid in the processing fluid may be in saturated state within a short time because of the small capacity of the processing fluid in the first circulation line 53. Therefore, it is necessary to frequently discharge the processing fluid in the first circulation line 53 while processing the wafer W. Therefore, the frequency of discharging the processing fluid is increased. Thus, it is necessary to supplement a new processing fluid every time. In contrast, according to the present exemplary embodiment, the processing fluid in the first circulation line 53 may be used for a long time. Thus, the consumption of the new processing fluid may be reduced.

However, the capacity of the first reservoir tank 20 and the second reservoir tank 62 is 20 L, which is significantly larger than the capacity (for example, 1 L) of the processing container 1. Therefore, as described above, the capacity of the processing fluid in the first circulation line 53 having the reservoir tank 20 and the second circulation line 60 having the reservoir tank 62 may be increased.

For example, the first reservoir tank 20 is provided in the first circulation line 53 so that, for example, 100 sheets (plural) of wafers may be processed using the processing fluid in the first circulation line 53.

For example, in the case of the dry preventing liquid, approximately 10 vol % of IPA is dissolved in the first circulation tank 20 of 20 L so that in the first reservoir tank 20, 2 L of IPA may be dissolved. That is, 2 L of IPA (=20 mL of IPA paddle on a wafer×100 sheets (plural) of wafers to be processed) may be dissolved in the processing fluid in the first circulation line 53.

As described above, the downstream-side switch valve 65a is used to switch the first circulation line 53 and the second circulation line 60.

For example, before the solubility of the dry preventing liquid in the processing fluid of the first circulation line 53 is saturated (for example, after processing 100 sheets of wafers W), the first circulation line 53 is switched to the second circulation line 60. As described above, the second circulation line 60 has the same configuration as the first circulation line 53 and the first circulation line 53 and the second circulation line 60 are switched by the downstream-side switch valve 65a. Specifically, when the processed wafers reach the number of wafers to be processed, the first circulation line 53 is switched to the second circulation line 60 and the processing fluid in the first reservoir tank 20 of the first circulation line 53 is discharged from the fluid discharge device 21 while using the second circulation line 60. Similarly, when the processed wafers reach the number of wafers to be processed, the second circulation line 60 is switched to the first circulation line 53 and the processing fluid in the second reservoir tank 62 of the second circulation line 60 is discharged from the fluid discharge device 63.

The wafer processing apparatus with the above-described configuration includes a controller 6. The controller 6 is configured by a computer 6a including a CPU and a storage unit and is connected to the processing container 1, the booster pump 2, the first circulation pump 3, and the second circulation pump 61, various valves 51a, 52a, 53a, 53b, 60a, and 60b, the opening/closing valves 21b and 63b, the fluid meters 53c and 60c, and the downstream-side switch valve 65a. In the storage unit of the controller 6, a program which includes a group of steps (commands) organized for control related to an operation of the wafer processing apparatus, that is, an operation of carrying the wafer W in which the surface is wet with the dry preventing liquid in the processing container 1, removing the liquid by the processing fluid, and then withdrawing the wafer W is recorded. The program is stored in a storage medium 6b such as a hard disk, a compact disk, a magneto optical disk, or a memory card and then installed in the computer therein.

Next, an operation of the exemplary embodiment configured by the above-described configuration, that is, a substrate processing method will be described below.

Figure 3:
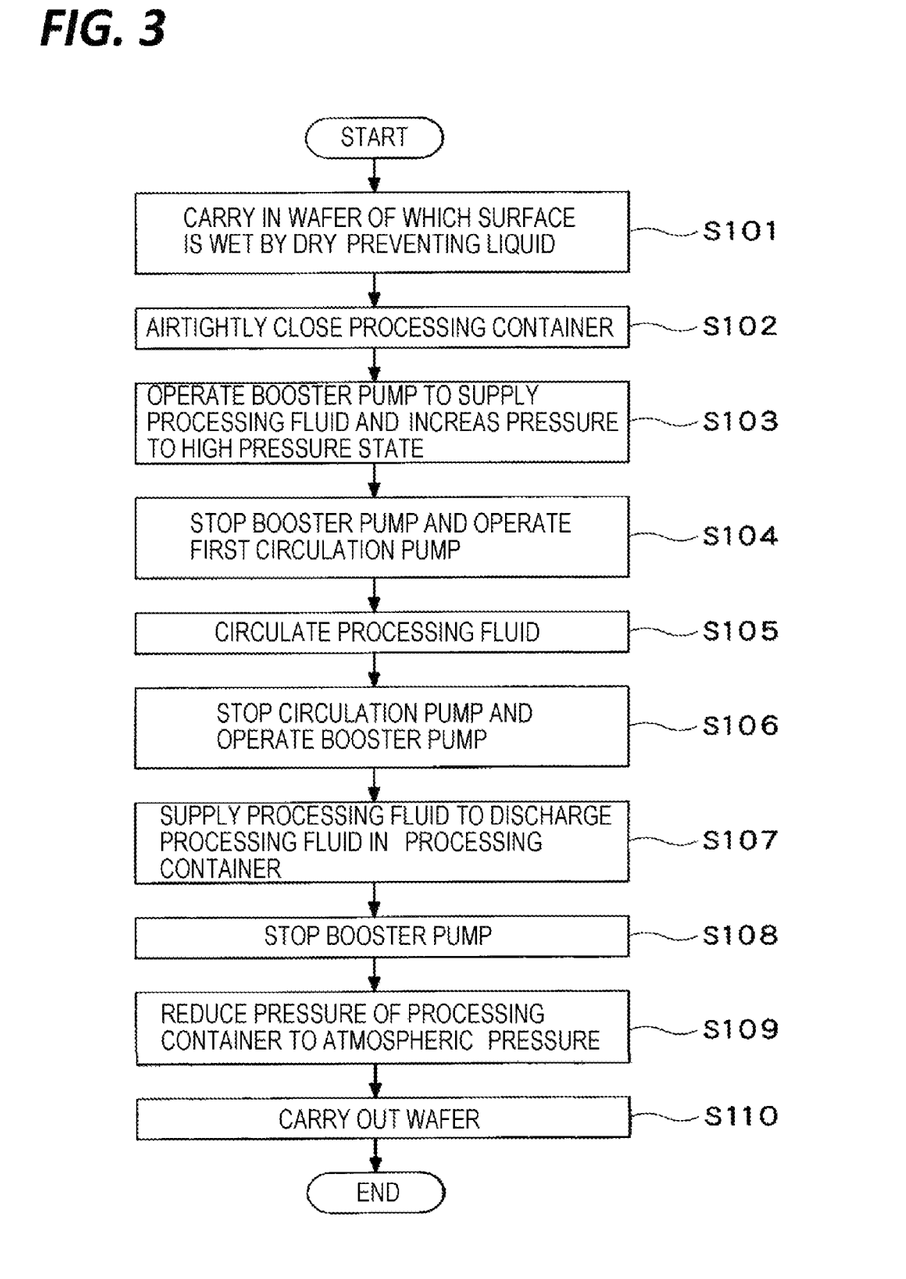
FIG. 3 is a flowchart illustrating a flow of an operation of a substrate processing apparatus.

As illustrated in FIG. 3, when a liquid processing of removing minute dust or a natural oxide film on the surface of the wafer W is completed in the liquid processing apparatus during the previous process, a dry preventing liquid such as isopropyl alcohol (IPA) is supplied onto the surface of the wafer W in the liquid processing apparatus and is delivered to a wafer conveying arm so that the wafer W is conveyed to the processing container 1 of the substrate processing apparatus 10 according to the present disclosure (start).

Continuously, after the wafer W is delivered to a lift pin (not illustrated) provided in the processing container 1 and the wafer W is placed on the holding plate 16 of the processing container 1, the wafer W is carried into the container body 11 through the opening 12 (step S101) and then the processing container 1 is airtightly closed (step S102). Thereafter, the opening/closing valve 51a of the fluid supply line 51 and the opening/closing valve 53a of the first circulation line 53 are opened, and the booster pump 2 is activated to supply a processing fluid such as carbon dioxide ($CO_2$) to the processing container 1 and increases the pressure in the processing container 1 and the first reservoir tank 20 to a pressure at which the inside of the processing container 1 and the first reservoir tank 20 becomes a high pressure state (a supercritical state or a subcritical state) (step S103).

Therefore, when the inside of the processing container 1 and the first reservoir tank 20 become a high pressure processing fluid atmosphere, the booster pump 2 stops, the opening/closing valve 51a of the fluid supply line 51 is closed, the opening/closing valves 53a and 53b of the first circulation line 53 are closed, and the first circulation pump 3 is operated (step S104).

During this time, an operation of circulating a fluid in the processing container 1 by the first circulation pump 3 is performed (step S105). As described above, a mixed fluid formed of the processing fluid and the dry preventing liquid in the processing container 1 is circulated by the first circulation pump 3 having a larger ejection amount. Thus, the mixing of the processing fluid and the dry preventing liquid may be facilitated in the processing container 1. As a result, the processing fluid near the surface of the wafer W is suppressed from being saturated by the dry preventing liquid. Thus, the ability of removing the liquid may be suppressed from being lowered.

Figure 4:
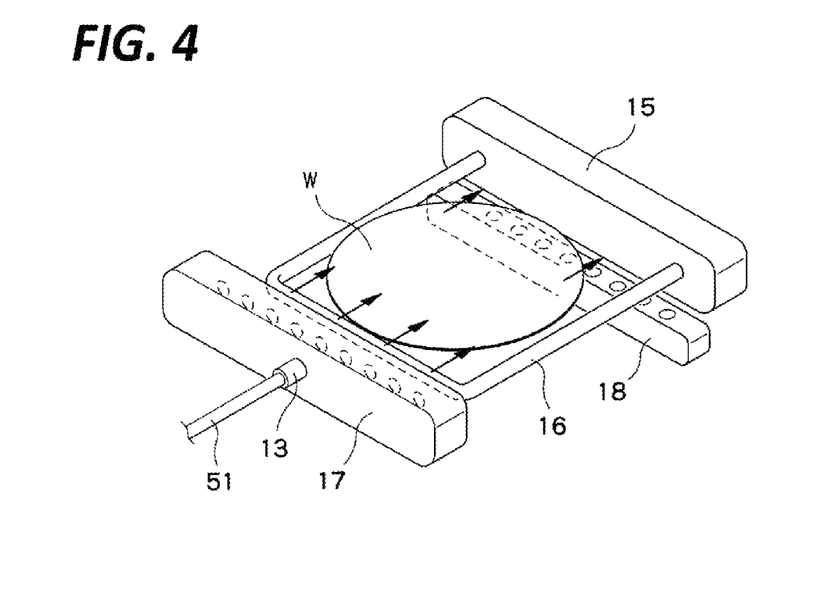
FIG. 4 is a view illustrating an internal structure of the processing container.
Figure 5:
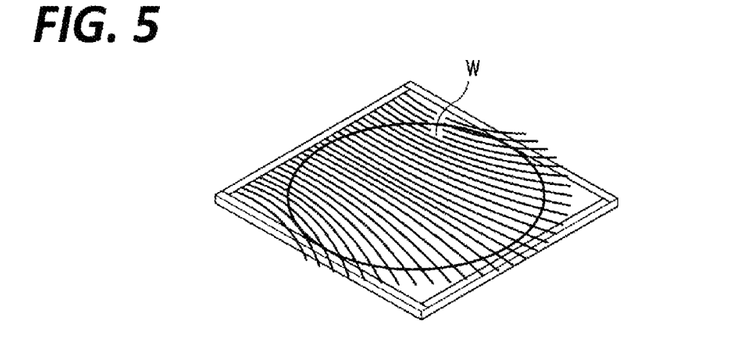
FIG. 5 is a view illustrating a flow of a supercritical processing fluid in the processing container.

Next, flow of the fluid in the processing container 1 will be described with reference to FIGS. 4 and 5. As illustrated in FIGS. 4 and 5, the processing container 1 is provided with a fluid supply header 17 that is connected to the fluid supply line 51 and has a plurality of holes, and a fluid discharge header 18 that is connected to the fluid discharge line 52 and has a plurality of holes. The fluid supply header 17 is provided on one wall of the container body 11 of the processing container 1 and the fluid discharge header 18 is provided on the other side of the container body 11 so that the holes of the fluid supply header 17 and the holes of the fluid discharge header 18 face each other. In this case, the wafer W and the holding plate 16 are disposed to have an interval of approximately 1 mm from the inner wall of the processing container 1.

Therefore, the fluid supplied from the fluid supply header 17 has a uniform flow rate distribution in a plane of the wafer W. Then, the fluid is sent to the fluid discharge header 18 and flows on the wafer W. Thus, the dry preventing liquid on the wafer W is securely dissolved into the processing fluid.

During this time, the dry preventing liquid is dissolved in the processing liquid in the first circulation line 53, and the concentration of the dry preventing liquid in the processing liquid is increased. However, since the first reservoir tank 20 is provided in the first circulation line 53, the capacity of the processing fluid in the first circulation line 53 may be increased. Thus, the increase in concentration of the dry preventing liquid dissolved in the processing fluid may be suppressed. Therefore, the processing fluid in the first circulation line 53 may be used for a long time. Thus, the consumption of the processing fluid may be reduced.

Next, the opening/closing valves 53a and 53b of the first circulation line 53 are closed, the first circulation pump 3 stops, the opening/closing valve 51a of the fluid supply line 51 is opened, and the booster pump 2 is operated (step S106). Further, a decompression valve 52a of the fluid discharge line 52 is opened. Therefore, a new processing fluid is supplied from the fluid supply line 51 to the processing container 1, and the fluid in the processing container 1 is discharged (step S107). In this case, the concentration of the dry preventing liquid in the processing fluid flowing through the processing container 1 or the fluid discharge line 52 is reduced to be zero (0) as far as possible. Thus, it is possible to prevent condensation of the dry preventing liquid at the time of discharging the processing fluid and reattachment of the dry preventing liquid onto the wafer W. It is also possible to prevent occurrence of pattern collapse due to the reattachment.

Then, after the lapse of a predetermined time sufficient to remove the dry preventing liquid on the surface of the wafer W, the booster pump 2 stops, so that the supply of the processing fluid stops (step S108). Further, the opening/closing valve 51a of the fluid supply line 51 is closed. Meanwhile, the fluid in the processing container 1 is discharged while the decompression valve 52a of the fluid discharge line 52 is opened such that the pressure is reduced to an atmospheric pressure (step S109). As a result, the dry preventing liquid extracted from the processing fluid is discharged from the processing container 1 to the outside together with the processing fluid, and the liquid on the surface is removed. Thus, a dried wafer W may be obtained.

When the pressure in the processing container 1 is lowered to the atmospheric pressure, the decompression valve 52a of the fluid discharge line 52 is closed, the holding plate 16 is moved to carry out the wafer W (step S110), and the wafer W is delivered to the external conveying arm. Thus, the processing is terminated (end).

When the wafers processed in the processing container 1 reaches a predetermined number of sheets (e.g., 100 sheets), the controller 6 operates the downstream-side switch valve 65a to switch the first circulation line 53 to the second circulation line 60. Further, a processing fluid before the solubility of the dry preventing liquid in the processing fluid of the first circulation line 53 is saturated in the first reservoir tank 20 of the first circulation line 53 is discharged from the fluid discharge device 21, while the second circulation line 60 is used.

Similarly, when the wafers processed in the processing container 1 reaches a predetermined number of sheets, the downstream-side switch valve 65a is operated to switch the second circulation line 60 to the first circulation line 53. Further, a processing fluid before the solubility of the dry preventing liquid in the processing fluid of the second circulation line 60 is saturated in the second reservoir tank 62 of the second circulation line 60 is discharged from the fluid discharge device 63, while the first circulation line 53 is used.

Therefore, the processing fluid used in the processing container 1 may be used for a long time. Therefore, it is not necessary to frequently discharge the processing fluid supplied in the processing container 1 while processing the wafer W. In addition, it is not necessary to supplement the new processing fluid every time.

The first circulation line 53 and the second circulation line 60 are switched using the downstream-side switch valve 65a so that the processing fluid before the solubility of the dry preventing liquid in the processing fluid in the first reservoir tank 20 of the first circulation line 53 and the processing fluid in the second reservoir tank 62 of the first circulation line 60 is saturated may be smoothly discharged to the outside.

According to the exemplary embodiment, the fluid in the processing container 1 is circulated using the first circulation pump 3 (the ejection flow rate is desirably 10 to 40 L/min and more desirably 10 to 20 L/min) having a higher ejection flow rate than that of the booster pump 2 (the ejection flow rate is desirably 0.1 to 3.0 L/min and more desirably 0.5 to 1.0 L/min) which supplies the processing fluid to the processing container 1. Thus, mixing of the processing fluid and the liquid on the surface of the wafer W may be facilitated in the processing container 1.

Since the first reservoir tank 20 is provided in the first circulation line 53 and the second reservoir tank 62 is provided in the second circulation line 60, a large capacity of the processing fluid may be achieved in the first circulation line 53 and the second circulation line 60. Therefore, the dissolved concentration of the dry preventing liquid in the processing fluid may be suppressed to be low. Therefore, it is not necessary to frequently discharge the processing fluid while processing the wafer W to supplement a new processing fluid every time, but the processing fluid in the first circulation line 53 and the second circulation line 60 may be used for a long time, thereby reducing the consumption of the processing fluid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing container configured to receive a substrate on which a dry preventing liquid is filled and perform a supercritical processing on the substrate;

a fluid supply line connected to the processing container via a first valve and configured to supply a processing fluid to the processing container;

a fluid discharge line connected to the processing container and configured to discharge the processing fluid in the processing container;

a first circulation line connected to an upstream side and a downstream side of the processing container via a second valve, and provided independently from the fluid supply line and the fluid discharge line to circulate the processing fluid in the processing container; and a controller configured to control an overall operation of the substrate processing apparatus, wherein the first circulation line is provided with a first reservoir tank that receives the processing fluid from the processing container and has a capacity larger than that of the processing container, the fluid supply line is provided with a booster pump that boosts the processing fluid to a pressure at which the processing fluid becomes a supercritical state and supplies the processing fluid to the processing container, the first circulation line is provided with a first circulation pump to circulate the processing fluid in the processing container, and when the processing fluid in an inside of the processing container and the first reservoir tank reaches the supercritical state, the controller stops the booster pump, closes the first valve of the fluid supply line and the second valve of the first circulation line, and controls the first circulation pump such that an ejection flow rate of the first circulation pump is higher than an ejection flow rate of the booster pump.

2. The substrate processing apparatus of claim 1, wherein the first reservoir tank has a capacity such that the dry preventing liquid filled on the substrate is not saturated even when the dry preventing liquid is dissolved in the processing fluid of a supercritical state or a subcritical state in the first reservoir tank.

3. The substrate processing apparatus of claim 1, wherein the first reservoir tank is provided at an upstream side of the first circulation pump.

4. The substrate processing apparatus of claim 1, wherein the first reservoir tank includes a fluid discharge device to discharge the processing fluid.

5. The substrate processing apparatus of claim 1, further comprising:

a second circulation line connected at an upstream side and a downstream side of the processing container, and provided independently from the first circulation line to circulate the fluid in the processing container, wherein the second circulation line is provided with a second reservoir tank that receives the processing fluid from the processing container and has a capacity larger than that of the processing container.

6. The substrate processing apparatus of claim 5, wherein the processing container includes a downstream-side switch valve at a downstream side thereof to switch the first circulation line and the second circulation line, and the controller is configured to operate the downstream-side switch valve to switch the first circulation line to the second circulation line when a number of substrates processed in the processing container reaches a predetermined number.

7. The substrate processing apparatus of claim 1, wherein the processing container includes a fluid supply header connected to the fluid supply line and a fluid discharge header connected to the fluid discharge line so as to form a laminar flow of the processing fluid in the processing container.

8. A substrate processing method, comprising:

carrying a substrate on which a dry preventing liquid is filled into a processing container;

supplying a processing fluid to the processing container through a fluid supply line with a first valve;

performing a supercritical processing on the substrate in the processing container using the processing fluid;

discharging the processing fluid in the processing container through a fluid discharge line; and circulating the processing fluid in the processing container by a first circulation line connected to an upstream side and a downstream side of the processing container with a second valve which is provided independently from the fluid supply line and the fluid discharge line, wherein the processing fluid from the processing container is received by a first reservoir tank that is provided in the first circulation line and has a capacity larger than that of the processing container, the fluid supply line is provided with a booster pump that boosts the processing fluid to a pressure at which the processing fluid becomes a supercritical state and supplies the processing fluid to the processing container, the first circulation line is provided with a first circulation pump to circulate the processing fluid in the processing container, and in the circulating the processing fluid, when the processing fluid in an inside of the processing container and the first reservoir tank reaches the supercritical state, the booster pump is stopped, the first valve of the fluid supply line and the second valve of the first circulation line are closed, and the first circulation pump is controlled such that an ejection flow rate of the first circulation pump is higher than an ejection flow rate of the booster pump.

9. A non-transitory computer-readable storage medium that stores a program which, when executed, causes a computer to execute a substrate processing method, the substrate processing method including:

carrying a substrate on which a dry preventing liquid is filled into a processing container;

supplying a processing fluid to the processing container through a fluid supply line with a first valve;

performing a supercritical processing on the substrate in the processing container using the processing fluid;

discharging the processing fluid in the processing container through a fluid discharge line; and circulating the processing fluid in the processing container by a first circulation line connected to an upstream side and a downstream side of the processing container with a second valve which is provided independently from the fluid supply line and the fluid discharge line, wherein the processing fluid from the processing container is received by a first reservoir tank that is provided in the first circulation line and has a capacity larger than that of the processing container, the fluid supply line is provided with a booster pump that boosts the processing fluid to a pressure at which the processing fluid becomes a supercritical state and supplies the processing fluid to the processing container, the first circulation line is provided with a first circulation pump to circulate the processing fluid in the processing container, and in the circulating the processing fluid, when the processing fluid in an inside of the processing container and the first reservoir tank reaches the supercritical state, the booster pump is stopped, the first valve of the fluid supply line and the second valve of the first circulation line are closed, and the first circulation pump is controlled such that an ejection flow rate of the first circulation pump is higher than an ejection flow rate of the booster pump.

10. The substrate processing apparatus of claim 1, wherein the ejection flow rate of the booster pump is about 0.1 to about 3.0 L/min, and the ejection flow rate of the first circulation pump is about 10 to about 40 L/min.

11. The substrate processing apparatus of claim 1, wherein the ejection flow rate of the booster pump is about 0.5 to about 1.0 L/min, and the ejection flow rate of the first circulation pump is about 10 to about 20 L/min.

12. The substrate processing apparatus of claim 1, wherein the fluid discharge line includes a decompression valve that reduces a pressure of the processing container.

13. The substrate processing apparatus of claim 6, wherein the first circulation line includes a flow meter between the downstream-side switch valve and the first reservoir tank.

* * * * *